United States Patent
Kohno et al.

Patent Number: 5,532,948
Date of Patent: Jul. 2, 1996

[54] RANK ORDER FILTER

[75] Inventors: Masahiro Kohno, Kobe; Hiroshi Nittaya, Ikoma-gun; Masahiro Kato, Kobe, all of Japan

[73] Assignee: Sumitomo Metal Industries, Ltd., Osaka, Japan

[21] Appl. No.: 177,989

[22] Filed: Jan. 6, 1994

[30] Foreign Application Priority Data

Jan. 13, 1993 [JP] Japan ................................ 5-022167

[51] Int. Cl.⁶ .............................. G06F 7/00; G06F 7/02
[52] U.S. Cl. ........................ 364/715.06; 340/146.2
[58] Field of Search ........................ 364/715.01, 715.06, 364/724.01; 340/146.2

[56] References Cited

U.S. PATENT DOCUMENTS

| | | | |
|---|---|---|---|
| 3,740,538 | 6/1973 | Hemphill | 364/715.06 X |
| 4,513,440 | 4/1985 | Delman | 364/715.01 X |
| 4,651,301 | 3/1987 | Ballmer et al. | 340/146.2 |
| 4,802,108 | 1/1989 | Bagdis et al. | 364/715.01 |
| 4,918,636 | 4/1990 | Iwata et al. | 364/715.06 |
| 5,122,979 | 1/1992 | Culverhouse | 364/715.06 |
| 5,220,664 | 6/1993 | Lee | 340/146.2 X |

FOREIGN PATENT DOCUMENTS

| | | |
|---|---|---|
| 3-162117 | 7/1991 | Japan . |
| 5-22637 | 1/1993 | Japan . |
| 2194364 | 3/1988 | United Kingdom . |

*Primary Examiner*—Roy N. Envall, Jr.
*Assistant Examiner*—Chuong D. Ngo
*Attorney, Agent, or Firm*—Burns, Doane, Swecker & Mathis

[57] ABSTRACT

A rank order filter is disclosed in which the maximum value, the minimum value and the median value are determined in a 3×3 local area having three sample values in each of column and row. The three sample values in the 3×3 local area are rearranged in descending order of magnitude by column, and the maximum values or the minimum values in each column are compared with each other thereby to determine the maximum value or the minimum value in the 3×3 local area. Also, after comparing the median values with each other in each column, the maximum value in the column having the minimum median value, the minimum value in the column having the maximum median value and the median value in the column having the median median value are compared with each other. The result of comparison is used to determine the median value in the 3×3 local area.

4 Claims, 3 Drawing Sheets

RANK ORDER FILTER

BACKGROUND OF THE INVENTION

1. Field of the Invention

The present invention relates to a rank order filter used with an image processing apparatus, an audio processing apparatus, etc., for determining the maximum value, the minimum value and the median value among a plurality of input digital values (sample values).

2. Description of Related Art

Rank order filtering is widely used in image processing systems, audio processing systems, etc. In this process, a one-dimensional or multi-dimensional signal having discrete sample values is inputted and smoothed in nonlinear fashion. Specifically, a plurality of (N) sample values are applied to a rank order filter, and only nth ($1 \leq n \leq N$) lower one of the N sample values is selectively output. In the process, n is the rank order of the rank order filter.

In the case where n is $(N+1)/2$, the median value is selected from the N sample values. In this case, the rank order filter is referred to as the median value filter. Also, when n is N, the maximum value is selected from the N sample values, in which case the rank order filter is called the maximum value filter. Further, when n is 1, the minimum value is selected from the N sample values, and the rank order filter is called the minimum value filter.

In the case where the central value filter is used, the short-term discontinuous component generated suddenly tends to be removed by this filter, and the use of the central value filter is effective in reducing the very short-term noises from the signal processed. Also, the maximum value filter is effectively used for removing the noise which assume small values among a plurality of input sample values. Further, the minimum value filter is used effectively to eliminate the noises of large values from among a plurality of input sample values.

Digital two-dimensional image data are input sequentially by raster scan from the upper left corner of the screen 51 as shown in FIG. 1. With respect to this input image, as shown in FIG. 1, a given pixel is designated as a center pixel (coordinate (h, v)) and the neighboring eight pixels along three columns (vertical) and three rows (horizontal) of pixels covering a total of 3×3 pixels are set as a local area. The sample values of these nine pixels are subjected to rank order filtering. In FIG. 1, the 3×3 local area is specifically comprised of nine pixels indicated by coordinates (h−1, v−1), (h, v−1), (h+1, v−1), (h−1, v), (h, v), (h+1, v), (h−1, v+1), (h, v+1), (h+1, v+1). The sample values (density values) of these nine pixels are applied to the rank order filter, and rearranged in descending order of magnitude, so that the nth lower sample value,. (such as the median value, the maximum value or the minimum value) are selectively output, as described above.

In conventional rank order filters, only after all sample values are compared, they are rearranged in descending order of magnitude. As a result, rearrangement of nine sample values, for example, needed about $_9C_2$ (=36) combinations of comparisons. For realizing this comparison operation with a digital circuit, 36 magnitude comparators are used for making a comparison by each comparator, or each of a smaller number of magnitude comparators is required to perform a plurality of comparisons. Thus, the conventional rank order filters posed the problem of a larger circuit scale and a low processing speed.

SUMMARY OF THE INVENTION

The primary object of the invention is to provide a rank order filter small in the number of comparison operations, small in circuit size, and high in processing speed.

Another object of the invention is to provide a rank order filter which is easily capable of determining the maximum, minimum and median values within a 3×3 local area having three sample values each along column and row.

According to one aspect of the invention, there is provided a rank order filter having first comparing means for comparing the magnitude of three sample values as a unit along column or row in a 3×3 local area having three sample values in each of column and row, and second comparing means for comparing the magnitude of the three maximum or minimum values obtained from the first comparing means, wherein the maximum value or minimum value of the nine sample values in the 3×3 local area is determined in accordance with the result of comparison at the second comparing means. The maximum value or minimum value of the nine sample values in the 3×3 local area can be determined by a smaller number of arithmetic operations for comparison, and therefore a maximum value filter or a minimum value filler small in circuit scale and high in processing speed can be realized with a small number of comparators and signal switches without using any bulky circuit configuration.

According to another aspect of the invention, there is provided a rank order filter having first, comparing means for comparing the magnitude of three sample values as a unit along column or row in a 3×3 local area having three sample values in each of column and row, second comparing means for comparing the magnitude of the three median values obtained from the first comparing means, and third comparing means for comparing the maximum value in the column or row decided by the second comparing means to have the minimum median value therein, the minimum value in the column or row decided by the second comparing means to have the maximum median value therein, and the median value in the column or row decided by the second comparing means to have the median median value therein, wherein the median value of the nine sample values within the 3×3 local area is determined in accordance with the result of comparison made by the third comparing means. The median value of the nine sample values in the 3×3 local area can be determined by a small number of comparative arithmetic operations. Therefore, it is possible to realize a median value filter small in circuit scale and high in processing speed including a small number of comparators and signal switches without using any bulky circuit configuration.

Incidentally, three sample values either in column or row may be input ted concurrently so that sets of three sample values are sequentially shifted to form a 3×3 local area. As an alternative, nine sample values are sequentially inputted, and a 3×3 local area is formed by using these serial nine sample values.

The above and further objects and features of the invention will more fully be apparent from the following detailed description with accompanying drawings.

DESCRIPTION OF THE PREFERRED EMBODIMENTS

Figure 1:
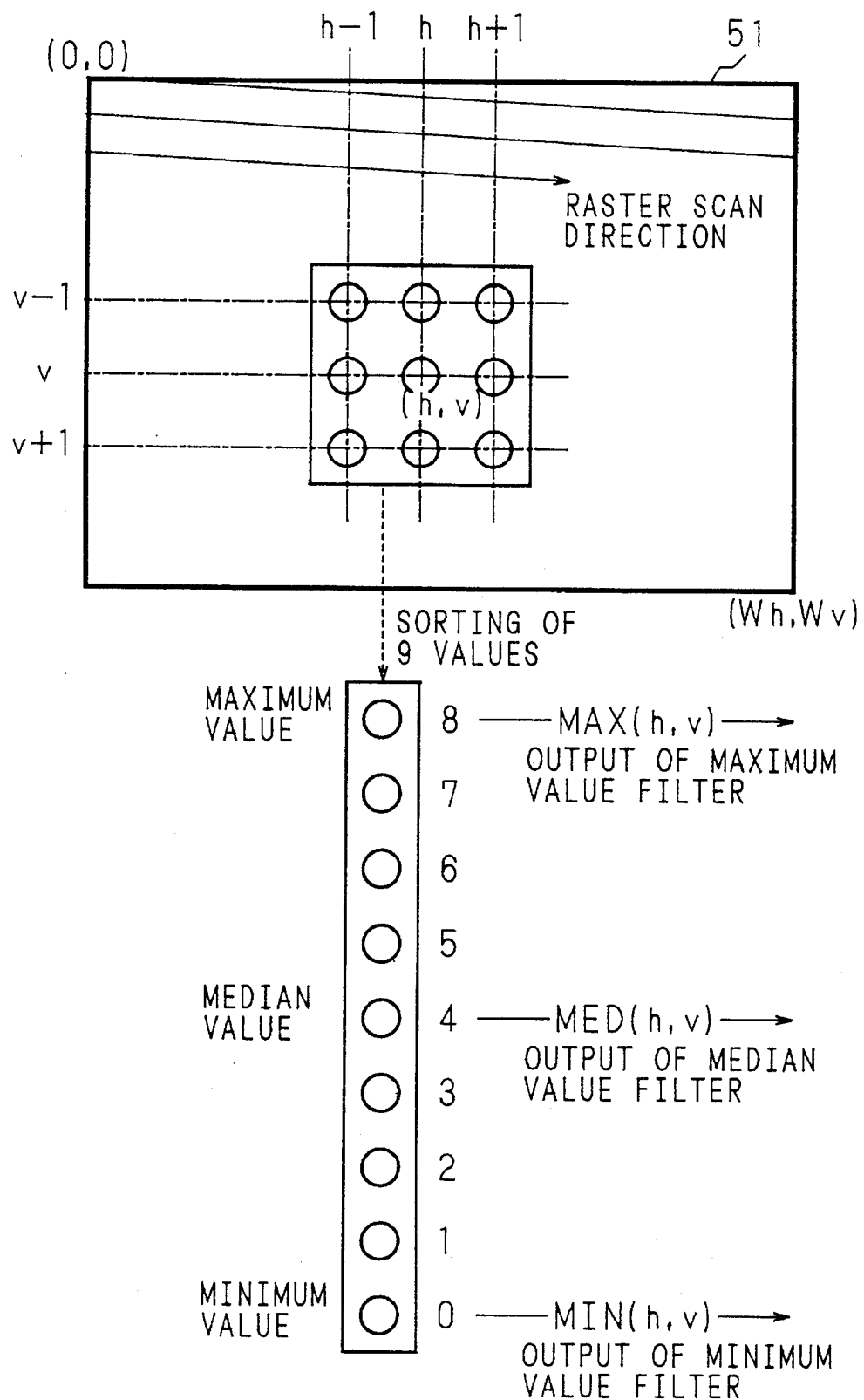
FIG. 1 is a schematic diagram showing input data to a rank order filter and the conventional rank order filtering operation.

The principle of determining and the procedure for calculating the maximum value, the minimum value and the median value in a rank order filter according to the invention will be explained.

First, description is made about the principle of determining and the procedure for calculating the maximum value and the minimum value of nine sample values in a 3×3 local area. Three sample values along the column (or the row) in the 3×3 local area are compared in magnitude as a unit, and then the maximum value of the three maximum values is determined as a maximum value associated with the particular local area, or the minimum value of the three minimum values is determined as a minimum value associated with the particular local area.

Next, explanation will be made about, the principle of determining and the procedure for calculating the median value of nine sample values in a 3×3 local area. Three sample values along the column (or the row) in the 3×3 local area are compared in magnitude as a unit. With regard to the result of these comparisons, the maximum value for each column (or each row) is labeled MAX, the median value MED and the minimum value MIN. As the next step, the median values for three columns (or rows) are compared with each other. With regard to the result of this comparison, the column (or the row) associated with the maximum median value is designated as "max", the column (or the row) associated with the median median value as "med", and the column (or the row) associated with the minimum median value as "min".

In accordance with the result of these two comparisons, English uppercase letters MAX, MED and MIN indicating the result of magnitude comparison in each column (or each row) are combined with the English lowercase letters "max", "med" and "min" indicating the result of magnitude comparison between the median values for each column (or each row) to indicate nine sample values. In the case where a median value is involved as a result of comparison within a particular column (or a particular row) and the particular median value also provides the median value as a result of comparison with the median values for the other two columns (or the other two rows), for example, the sample value is designated as MEDmed. Also, in the case where a maximum value is involved as a result of comparison within a particular column (or row) and the median value for the same column (or row) is smaller than those for the remaining two columns (or rows), then the particular sample value is indicated as MAXmin. In similar fashion, the other seven sample values are given as MAXmax, MAXmed, MEDmax, MEDmin, MINmax, MINmed and MINmin.

The sample value which is likely to be the median value in a 3×3 local area is one of the following five sample values: Three sample values including MAXmed, MEDmed and MINmed for the column (or the row) having a median median value as a result of the second comparison between three median values, a maximum sample value MAXmin for the column (or the row) having a minimum median value as a result of comparison between three median values, and a minimum sample value MINmax for the column (or the row) having a maximum median value as a result of comparison between three median values. In this stage, five sample values likely to provide a median value have been selected.

Then, MEDmed, MAXmin and MINmax among the selected five sample values are compared in magnitude. In the case where MAXmin and MINmax are both larger than MEDmed, the minimum one of the three sample values MAXmed, MAXmin and MINmax is determined as a median value for the local area. In the case where MAXmin and MINmax are both smaller than MEDmed, on the other hand, the maximum one of the three sample values MINmed, MAXmin and MINmax is determined as a median value for the local area. Further, in the case where MEDmed assumes a median value among the three sample values, MEDmed is determined as a median value for the local area.

Next, a specific configuration and operation of a rank order filter according to the invention will be explained.

Figure 2:
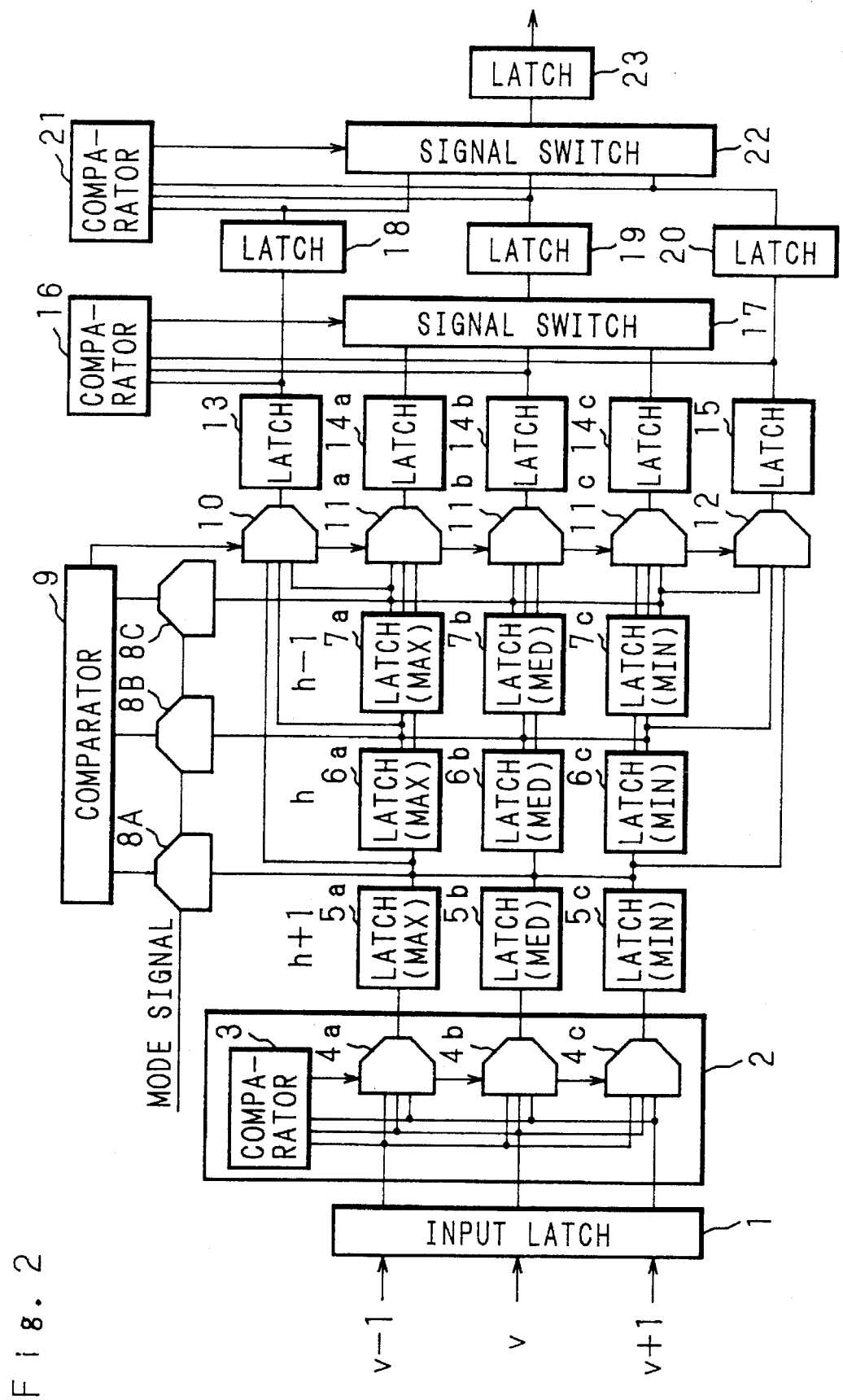
FIG. 2 is a block diagram showing a configuration of a rank order filter according to the invention.

FIG. 2 is a block diagram showing a configuration of a rank order filter according to the invention. In FIG. 2, numeral 1 designates an input latch for inputting the sample value of a pixel for each of adjacent three rows (v−1, v and v+1, see FIG. 1). The input latch 1 rearranges the sample values input thereto in the column and applies them to an in-column rearrangement circuit 2. The in-column rearrangement circuit 2 includes a comparator 3 for comparing three input sample values, and three signal switches 4a, 4b, 4c for selecting and outputting a desired one of the three input sample values in accordance with the result of comparison made at the comparator 3. The signal switch 4a applies the maximum sample value determined by a result of comparison at the comparator 3 to the latch 5a including a shift register. Also, the signal switch 4b applies the median sample value determined by a result of comparison at the comparator 3 to the latch 5b including a shift register. Further, the signal switch 4c applies the minimum sample value determined by a result of comparison at the comparator 3 to the latch 5c including a shift register.

The latch 5a is connected in series to latches 6a, 7a including shift registers, and the value of the latch 5a is transmitted to the latch 6a at each clock. The value of the latch 6a is transmitted to the latch 7a in response to the next one clock. Similarly, the latch 5b is connected in series to latches 6b, 7b including shift registers, so that the value of the latch 5b is transmitted to the latch 6b at each clocks and the value of the latch 6b is transmitted the latch 7b in response to the next one clock. In exactly the same fashion, the latch 5c is connected in series to latches 6c, 7c including shift registers, in such a way that the value of the latch 5c is transmitted to the latch 6c at each clock, while the value of the latch 6c is transmitted to the latch 7c in response to the next one clock. As a consequence, in this 3×3 latch array configured of nine latches, the latches 5a, 5b, 5c hold the three sample values of the (h+1) column of FIG. 1 in descending order of magnitude, the latches 6a, 6b, 6c hold the three sample values of the column h of FIG. 1 in descending order of magnitude, and the latches 7a, 7b, 7c hold the three sample values of the column (h−1) of FIG. 1 in descending order of magnitude.

The latches 5a, 5b, 5c are connected to a signal switch 8A, which selects one sample value from the latches 5a, 5b, 5c in accordance with the mode signal applied thereto front outside and applies it to a comparator 9. In similar manner, the latches 6a, 6b, 6c are connected to a signal switch which selects one sample value from the latches 6a, 6b, in accordance with the mode signal applied thereto from outside and applies it to the comparator 9. Further, in similar manner, the latches 7a, 7b, 7c are connected to a signal switch 8c, which selects one sample value from the latches 7a, 7b, 7c in accordance with the mode signal applied thereto from outside and applies it to the comparator 9. The comparator 9 compares the three sample values applied thereto in magnitude, and applies the result of comparison to signal switches 10, 11a, 11b, 11c, 12.

The signal switch 10 selects one sample value from the latches 5a, 6a, 7a and applies it to a latch 13. Also, the signal switch 12 selects one sample value from the latches 5c, 6c, 7c and applies it to a latch 15. The signal switch 11a selects one sample value from the latches 5a, 6a, 7a and applies it to a latch 14a. The signal switch 11b selects one sample value from the latches 5b, 6b, 7b and applies it to a latch 14b. Further, the signal switch 11c selects one sample value from the latches 5c, 6c, 7c and applies it to a latch 14c. The latches 13, 14b and 15 are connected to a comparator 16, which compares the sample values of the latches 13, 14b and 15 in magnitude. The result of comparison is applied to a signal switch 17. In accordance with the result of this comparison, the signal switch 17 selects one sample value from the latches 14a, 14b, 14c and applies it to a latch 19.

The sample value of the latch 13 is held in a latch 18 after a predetermined number of clocks, and the sample value of the latch 15 is held in a latch 20 after a predetermined number of clocks. The latches 18, 19 and 20 are connected to a comparator 21, which in turn compares the magnitude of the sample values of the latches 18, 19 and 20, and the result of this comparison is applied to a signal switch 22. The signal switch 22, on the basis of the result of this comparison, selects one sample value from the latches 18, 19 and 20 and applies it to a latch 23. The latch 23 outputs the sample value held therein (maximum value, minimum value or median value).

Next, the operation will be explained. The rank order filter configured as shown in FIG. 2 functions as a maximum value filter for outputting a maximum value within a predetermined 3×3 local area, as a minimum value filter for outputting a minimum value within a predetermined 3×3 local area, or also as a median value filter for outputting a median value within a predetermined 3×3 local area.

First, explanation will be made about the operation as a maximum value filter which outputs a maximum value within a predetermined 3×3 local area. The sample value of the pixels in three rows in raster scan are applied in parallel to the input latch 1, and then are applied to the in-column rearrangement circuit 2. In the process, the three rows of input sample values, as shown in FIG. 1, correspond to the three rows v−1, v and v+1 in the 3×3 local area involved.

The three sample values applied to the in-column rearrangement circuit 2 are compared in magnitude at the comparator 3. The sample value providing a maximum value is applied to and held in the latch 5a through the signal switch 4a. The sample value thus held is expressed as MAX in the abbreviation as defined above. The sample value providing a median value is applied to and held in the latch 5b through the signal switch 4b. The sample value thus held is expressed as MED in the abbreviation as defined above. Further, the sample value providing a minimum value is applied to and held in the latch 5c through the signal switch 4c. The sample value thus held is expressed as MIN in the abbreviation as defined above. The sample values held in the latches 5a, 5b, 5c are transferred to and held in the adjacent latches 6a, 6b, 6c at every clock, and the sample values held in each of the latches 6a, 6b, 6c are transferred to and held in the adjacent latches 7a, 7b, 7c at the next clock. As described above, the sample values within the 3×3 local area are held in the nine latches 5a to 7c in a form rearranged in the order of magnitude of columns h−1, h and h+1.

The mode signal for determining a maximum value is applied to the signal switches 8A, 8B, 8C. In this case, the signal switches 8A, 8B, 8C select a maximum value (sample values of the latches 5a, 6a, 7a) for each column. The maximum sample value within the 3×3 local area is any one of the sample values held in the latches 5a, 6a, 7a holding the maximum sample values for each column, so that the sample values of the latches 5a, 6a, 7a are selected by the signal switches 8A, 8B, 8C and applied to the comparator 9. In the comparator 9, the three sample values are compared in magnitude, and the sample value representing the maximum value is selected by the signal switch 10. The sample value thus selected is applied to and held in the latch 13. After that, the sample value representing the maximum value is held in the latch 18 from the latch 13. The sample value held in the latch 18 is held further in the latch 23 and is outputted as a maximum value of the final result.

Next, explanation will be made about the operation of a maximum value filter, i.e., the operation of outputting the minimum value within a 3×3 local area. The operation of applying the sample values for each row sequentially to the input latch 1, rearranging the sample values in the 3×3 local area in the descending order of magnitude and holding them in the nine latches 5a to 7c, is the same as that of the maximum value filter described above, and therefore will not be explained again.

The mode signal for determining a minimum value is applied to the signal switches 8A, 8B, 8C. In this case, the signal switches 8A, 8B, 8C select the minimum value (the sample values of the latches 5c, 6c, 7c) for each column. The minimum sample value within the 3×3 local area is one of the sample values held in the latches 5c, 6c, 7c, so that the sample values of the latched 5c, 6c, 7c are selected at the signal switches 8A, 8B, 8C and applied to the comparator 9. In the comparator 9, the three sample values are compared in magnitude, and the sample value representing the minimum value thereof is selected at the signal switch 12. The sample value thus selected is applied to and held in the latch 15. Subsequently, the sample value representing the minimum value is held in the latch 20 from the latch 15. The sample value held in the latch 20 is further held in the latch 23 through the signal switch 22, and is outputted as a minimum value providing a final result.

Next, explanation will be made about the operation of a median value filter, i.e., the operation for outputting a median value within a 3×3 local area. The process of operation for inputting the sample values for each row sequentially to the input latch 1 and holding them in the nine latches 5a to 7c with the sample values in the 3×3 local area rearranged in descending order is the same as that of the maximum value filter described above and therefore will not be described again.

The mode signal for determining a median value is applied to the signal switches 8A, 8B, 8C. In this case, the median value for each column (sample values on the latches 5b, 6b, 7b) is selected at the signal switches 8A, 8B, 8C, and applied to the comparator 9. In the comparator 9, these three median values are compared in magnitude with each other, and the result of comparison is applied to the signal switches 10, 11a, 11b, 11c, 12. The maximum sample value (MAXmed as expressed in the abbreviation defined above) for the column having a median median value is selected by the signal switch 11a from the outputs of the latches 5a, 6a, 7a and applied to the latch 14a. Also, the median sample value (MEDmed as expressed in the abbreviation defined above) for the column having the median median value is selected by the signal switch 11b from the outputs of the latches 5b, 6b, 7b and applied to the latch 14b. Also, the minimum sample value (MINmed as expressed in the abbreviation defined above) for the column having the median median value is selected by the signal switch 11c from the outputs of the latches 5c, 6c, 7c and applied to the latch 14c. Further, the maximum sample value (MAXmin as expressed in the abbreviation defined above) for the column having a minimum median value is selected by the signal switch 10 from the outputs of the latches 5a, 6a, 7a and applied to the latch 13. Furthermore, the minimum sample value (MINmax as expressed in the abbreviation defined above) for the column having a maximum median value is selected by the signal switch 12 from the outputs of the latches 5c, 6c, 7c and applied to the latch 15. As described above, the five sample values likely to assume a median value are held the latches 13, 14a, 14b, 11c, 15 respectively.

The three sample values (MAXmin, MEDmed and MINmax) held in the latches 13, 14b, 15 respectively are applied to the comparator 16 and compared in magnitude with each other, the result of which is applied to the signal switch 17. And the result of comparison is used to determine the median values for the three cases described below respectively.

In the case where MAXmin and MINmax are both larger than MEDmed, the minimum value of the three sample values MAXmed, MAXmin and MINmax assumes a median value in the local area. In the case where MAXmin and MINmax are both smaller than MEDmed, on the other hand, the maximum value of the three sample values MINmed, MAXmin and MINmax provides a median value in the local area. Further, in the case where MEDmed is a median value between MAXmin and MINmax, MEDmed presents a median value in the local area.

As a result, when comparison by the comparator 16 decides that the sample values (MAXmin, MINmax) held in the latches 13, 15 are larger than the sample value (MEDmed) held in the latch 14b, the sample value (MAXmed) held in the latch 14a is selected by the signal switch 17 and applied to the latch 19. In the process, the sample value (MAXmin) held in the latch 13 is transferred to the latch 18, and the sample value (MINmax) held in the latch 15 is transferred to the latch 20. The three sample values (MAXmin, MAXmed, MINmax) held in the latches 18, 19, 20 are applied to the comparator 21, and compared in magnitude with each other, so that the information representing the minimum value thereof is applied to the signal switch 22. The sample value providing the minimum one of the three values selected by the signal switch 22 on the basis of this information is held in the latch 23 and outputted as a median value of the final result in the local area.

Also, in the case where comparison by the comparator 16 decides that the sample values (MAXmin, MINmax) held in the latches 13, 15 are smaller than the sample value (MEDmed) held in the latch 14b, the sample value (MINmed) held in the latch 14c is selected by the signal switch 17 and applied to the latch 19. At the same time, the sample value (MAXmin) held in the latch 13 is transferred to the latch 18, and the sample value (MINmax) held in the latch 15 is transferred to the latch 20. The three sample values (MAXmin, MINmed, MINmax) held in the latches 18, 19, 20 respectively are applied to the comparator 21 and compared in magnitude, so that the information representing the maximum value thereof is applied to the signal switch 22. The sample value providing a maximum one of the three values selected by the signal switch 22 on the basis of such information is held in the latch 23, and outputted as a median value of final result in the local area.

Further, in the case where it is decided as a result of comparison operation at the comparator 16 that the sample value (MEDmed) held in the latch 14b provides a median value of the sample values (MAXmin, MINmax) held in the latches 13, 15, the sample value (MEDmed) held in the latch 14b is selected by the signal switch 17, and applied to the latch 19. This sample value (MEDmed) provides a median value the local area, and therefore is selected at the signal switch 22, held in the latch 23, and outputted as a median value of final result in the local area.

The above-described embodiment involves sample values (density values) of image signal obtained by raster scan of the image and therefore concern a configuration in which three sample values are applied by column at the same time. Generally, however, the sample values of audio signal are produced continuously as serial data from an audio processing unit. The present invention is applicable also to the case where nine sample values are input in time series as in such a case.

Figure 3:
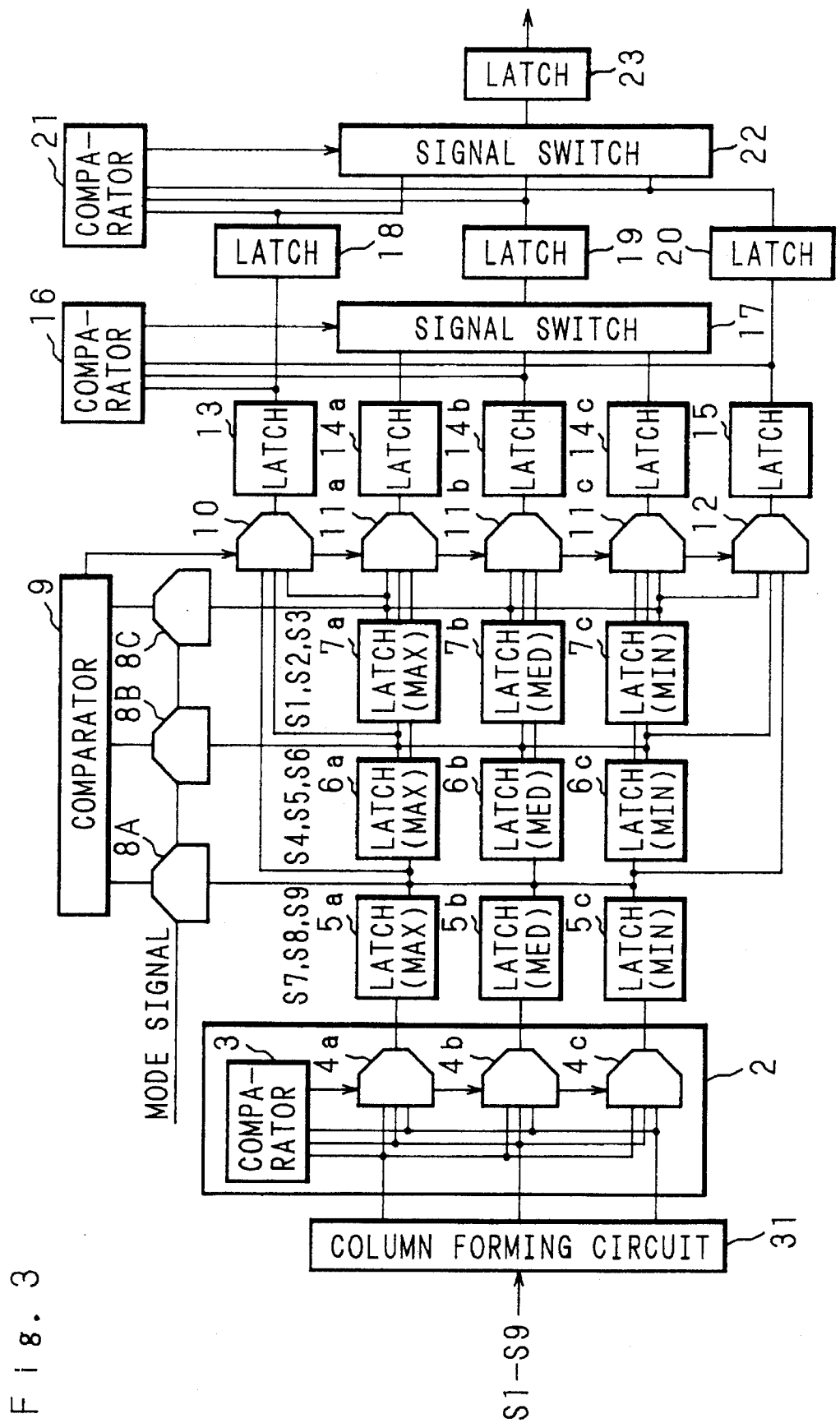
FIG. 3 is a block diagram showing a configuration of another rank order filter according to the invention.

FIG. 3 is a block diagram showing a configuration of a rank order filter according to the invention which is applicable to the case where nine sample values are input in time series. In FIG. 3, the same reference numerals as those in FIG. 2 designate the component parts identical to those shown in FIG. 2 respectively. Numeral 31 designates a column forming circuit supplied with sample values of the audio signal serially one at a time. The column forming circuit 31 configures three sample values continuously applied thereto as a unit and applies the three sample values for each column to the in-column rearrangement circuit 2. After that, as in the above-mentioned embodiment, the continuously-input nine sample values are compared in magnitude by column, three sample values at a time, and each one of them is held in the latches 5a, 5b, 5c, 6a, 6b, 6c, 7a, 7b, 7c respectively.

Assume for example that nine sample values S1, S2, S3, S4, S5, S6, S7, S8, S9 are applied in that order to the column forming circuit 31. The sample values S1, S2, S3 make up the first column, for which the maximum value, the median value and the minimum value are held in the latches 7a, 7b, 7c respectively. The sample values S4, S5, S6 make up the second column, for which the maximum value, the median value and the minimum value are held in the latches 6a, 6b, 6c respectively. In similar way, the sample values S7, S8, S9 make up the third column, for which the maximum value, the median value and the minimum value are held in the latches 7a, 7b, 7c respectively.

The sample values held in these latches are compared in magnitude thereby to determine the maximum value, the minimum value and the median value of the nine sample values. The operation involved is similar to that explained with reference to the preceding embodiment and will not be explained again.

By the way, although the above-described embodiments have a configuration in which three sample values in column are compared in magnitude as a unit in the first comparison process, the invention is also applicable with a configuration in which three sample values along the row are compared in magnitude as a unit.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A rank order filter for a 3×3 local area having three columns and three rows, with three sample values in each column and row, comprising:
   (1) first comparing means for comparing in magnitude, for each column or row, three sample values from a column or row of said 3×3 local area to determine three median values;
   (2) second comparing means for comparing in magnitude the three median values obtained by said first comparing means to determine which column or row has a minimum median value, which column or row has a maximum median value, and which column or row has a median median value; and
   (3) third comparing means for comparing in magnitude a maximum value A in the column or row determined by said second comparing means to have the minimum median value, a minimum value B in the column or row determined by said second comparing means to have the maximum median value, and a median value C in the column or row determined by said second comparing means to have the median median value; and
   (4) means for determining a median value of the nine sample values in the 3×3 local area, wherein the median value is selected as:
      (i) a minimum of: (a) said maximum value A, (b) said minimum value B and (c) a maximum value in the column or row determined by said second comparing means to have the median median value when said maximum value A and said minimum value B are both larger than said median median value;
      (ii) a maximum of: (a) said maximum value A, (b) said minimum value B and (c) the minimum value in the column or row determined by said second comparing means to have the median median value when said maximum value A and said minimum value B are both smaller than said median median value; or
      (iii) detecting said median value C as the median value of the nine sample values when said median value C is intermediate said maximum value A and said minimum value B.

2. A rank order filter according to claim 1, wherein said nine sample values are pixel values obtained from an image.

3. A rank order filter for determining a median value of nine input sample values, comprising:
   (1) means for forming a 3×3 matrix having three columns and three rows, with three sample values in each column and each row using the nine input sample values;
   (2) first comparing means for comparing in magnitude, for each column or row, three sample values from a column or row of the 3×3 matrix to determine three median values;
   (3) second comparing means for comparing in magnitude the three median values obtained by said first comparing means;
   (4) third comparing means for comparing in magnitude a maximum value A in the column or row determined by said second comparing means to have a minimum median value, a minimum value B in the column or row determined by said second comparing means to have a maximum median value, and a median value C in the column or row determined by said second comparing means to have a median median value; and
   (5) means for determining a median value of the nine input sample values wherein the median value is selected as:
      (i) a minimum of: (a) said maximum value A, (b) said minimum value B and (c) a maximum value in the column or row determined by said second comparing means to have the median median value when said maximum value A and said minimum value B are both larger than said median median value;
      (ii) a maximum of: (a) said maximum value A, (b) said minimum value B and (c) the minimum value in the column or row determined by said second comparing means to have the median median value when said maximum value A and said minimum value B are both smaller than said median median value; or
      (iii) detecting said median value C as the median value of the nine sample values when said median value C is intermediate said maximum value A and said minimum value B.

4. A rank order filter according to claim 3, wherein said nine sample values are signal values selected from a group consisting of image signal values and audio signal values.

* * * * *